United States Patent [19]

Brower

[11] 4,435,156
[45] Mar. 6, 1984

[54] SUBMINIATURE ARRAY WITH NORMALLY CLOSED AND NORMALLY OPEN SWITCHES

[75] Inventor: Boyd G. Brower, Williamsport, Pa.

[73] Assignee: GTE Products Corporation, Stamford, Conn.

[21] Appl. No.: 365,053

[22] Filed: Apr. 2, 1982

[51] Int. Cl.³ .............................................. F21K 5/00
[52] U.S. Cl. ...................................... 431/359; 362/4; 362/6; 362/15
[58] Field of Search .............. 431/359; 362/4, 6, 13–15

[56] References Cited

U.S. PATENT DOCUMENTS

| 4,290,747 | 9/1981 | Collins | 431/359 |
| 4,330,821 | 5/1982 | Brower et al. | 431/359 |

*Primary Examiner*—Carroll B. Dority, Jr.
*Attorney, Agent, or Firm*—Thomas H. Buffton

[57] ABSTRACT

A miniaturized multilamp photoflash array having a plurality of flashlamps affixed to a printed circuit on the inner surface of a circuit board with a continuous strip of switching material forming a plurality of normally closed (N/C) switches coupling the flashlamps to a common conductor and a plurality of normally open (N/O) switches coupling all but one of a plurality of flashlamps to an energizing conductor.

10 Claims, 3 Drawing Figures

SUBMINIATURE ARRAY WITH NORMALLY CLOSED AND NORMALLY OPEN SWITCHES

CROSS-REFERENCE TO OTHER APPLICATIONS

A concurrently filed application entitled "Subminiature Array Circuitry," bearing U.S. Ser. No. 365,057, filed in the name of the present inventor and assigned to the assignee of the present invention relates to an array utilizing a normally closed (N/C) switching circuit.

TECHNICAL FIELD

This invention relates to miniature and subminiature multilamp photoflash arrays and more particularly to miniature multilamp photoflash arrays utilizing normally closed (N/C) and normally open (N/O) switches for coupling and decoupling flashlamps to common and energizing conductors of an array.

BACKGROUND ART

Generally, it is known that fabricating so-called "printed circuits" by a die-stamping technique, rather than the well known etching process, is more efficient and provides a product of improved quality at reduced cost in labor and materials. Also, it is known that miniature and subminiature photoflash arrays are severely restricted insofar as space for both circuitry paths and components of the printed circuit are concerned. Thus, a photoflash array adapted to die-stamping circuit fabrication and improved space for circuitry and components represents a desired goal for miniature structures.

One known printed circuit design for a photoflash array is set forth in a pending application bearing U.S. Ser. No. 277,797, filed June 29, 1981, now U.S. Pat. No. 4,420,301, and assigned to the assignee of the present application. Herein, the printed circuit has a common circuit forming the perimeter of the circuit board. Also, such structures are not especially troublesome when the printed circuit is effected by an etching process, there are problems when die-stamping is employed. More specifically, a common circuit perimeter of the circuit board inhibits the removal of scrap material in a die-stamp operation since there are no free edges of scrap for grasping and thereby applying a removing force to the scrap material.

Also, the problems associated with limited space and miniaturized components is set forth in a pending application bearing U.S. Ser. No. 325,068, filed Nov. 25, 1981, and assigned to the assignee of the present application. Herein, the array utilizes a plurality of normally closed switches and clearly sets forth the problems associated with handling and fabricating these individual switches. Moreover, the suggested structure also includes so-called "blind" sections wherein the scrap from a die-stamp operation must be pulled in an opposite direction for removal.

Additionally, a concurrently filed application bearing U.S. Ser. No. 365,057, filed in the name of the present inventor and assigned to the assignee of the present invention is directed to "Subminiature Array Circuitry" and suggests apparatus wherein a plurality of normally closed (N/C) switches is utilized and constructed in a unique manner. Although this structure is a decided step forward in miniature photoflash arrays, it has been found that other problems are presented. More specifically, it has been found that consistency and repeatability of flashlamp short-circuiting leaves something to be desired. Thus, it would be desirable to provide increased assurance that a desired electrical connection is achieved.

OBJECTS AND SUMMARY OF THE INVENTION

An object of the present invention is to provide an enhanced miniaturized multilamp photoflash array. Another object of the invention is to provide a multilamp photoflash array having improved switching capabilities. Still another object of the invention is to maximize the space utilization of normally closed switching and circuit path componentry in a photoflash array. A further object of the invention is to provide a photoflash array having multiple switches and multiple energy return paths.

These and other objects, advantages and capabilities are achieved in one aspect of the invention by a miniaturized multilamp photoflash array wherein a continuous strip of switching material is utilized to provide a plurality of normally closed (N/C) switches coupling a plurality of flashlamps to a common conductor and a normally open (N/O) switch is coupled to all but one of the flashlamps and to an energizing conductor.

BEST MODE FOR CARRYING OUT THE INVENTION

For a better understanding of the present invention, together with other and further objects, advantages and capabilities thereof, reference is made to the following disclosure and appended claims in conjunction with the accompanying drawings.

Figure 1:
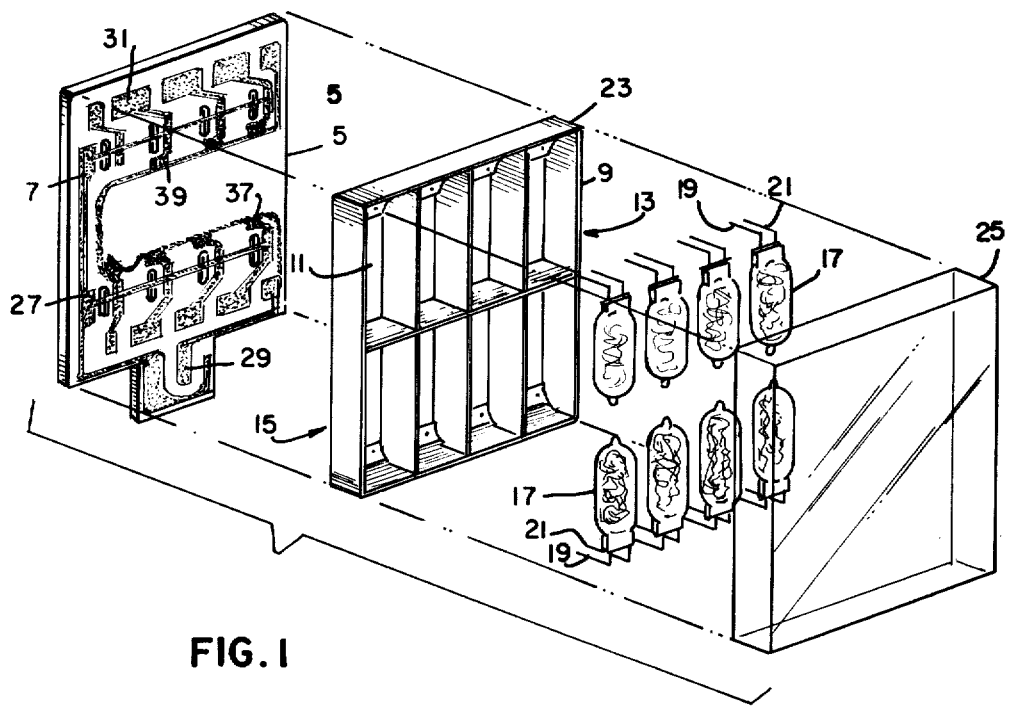
FIG. 1 is an exploded isometric view of a preferred form of miniaturized multilamp photoflash array of the invention.

In the drawings, FIG. 1 illustrates a preferred form of miniaturized multilamp photoflash array employing both normally open (N/O) and normally closed (N/C) switching arrangements. The array includes a circuit board 5 having a printed circuit 7 on the inner surfaces thereof. A reflector unit 9 includes a plurality of spaced cavities 11 arrayed in first and second rows, 13 and 15. Each of the cavities 11 may be, but not necessarily need be, of an open-back design and a plurality of flashlamps 17 are arrayed in rows similar to the reflector unit 9 with a flashlamp 17 nested within each of the cavities 11. The reflector unit 9 is attached to the circuit board 5.

Also, each of the flashlamps 17 includes a pair of electrically conductive leads 19 and 21 which are electrically connected to the printed circuit 7 on the circiuit board 5. These electrically conductive leads 19 and 21 may pass through apertures 23 in the reflector unit 9 as a means of attachment and support. A cover 25 of light transmittable material, plastic for example, is formed to enclose the flashlamps 17, reflector unit 9 and printed circuit 7 and is attached to the circuit board 5.

Figure 2:
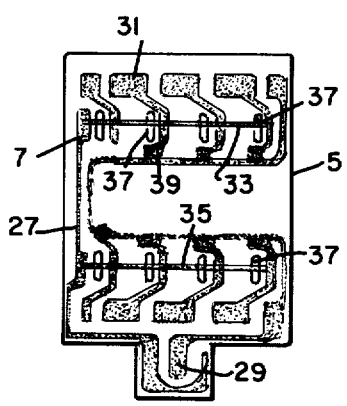
FIG. 2 is a plan view of the printed circuit and switching array of FIG. 1.

Referring more specifically to the circuit board 5 and printed circuit 7 of FIG. 1, FIG. 2 includes a printed circuit 7 having a common or ground conductor 27 and an energizing conductor 29. A plurality of circuit pads 31 are located to receive the electrically conductive leads 19 and 21 of FIG. 1 of a plurality of flashlamps 17 of FIG. 1. A first and second strip 33 and 35 of switching mterials is positioned to contact a plurality of the circuit pads 31 and provide a plurality of normally closed (N/C) switches 37. Also, each of the first and second strips 33 and 35 of switching material used to form the normally closed (N/C) switches 37 is connected to the common or ground conductor 27. Moreover, each of the normally closed (N/C) switches 37 is immediately adjacent one of the flashlamps 17 of FIG. 1.

Further, functional operation of the array causes the energizing conductor 29 of the printed circuit 7 to be positioned adjacent all but the last one of the circuit pads 31 and a plurality of normally open (N/O) switches 39 are located adjacent all but the last one of the circuit pads 31 and connected to the energizing conductor 29. Thus, all of the circuit pads 31 have a normally closed (N/C) switch adjacent thereto and a normally open (N/O) switch adjacent all but one of the circuit pads 31.

Figure 3:
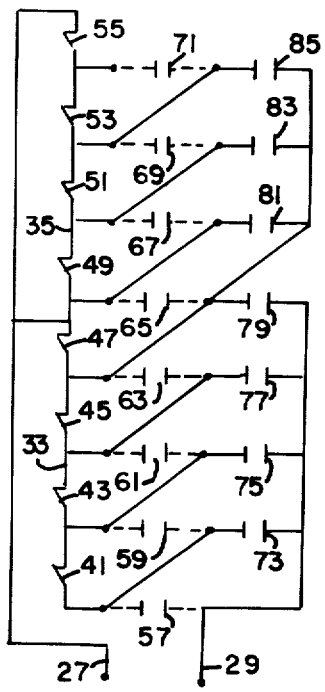
FIG. 3 is a schematic diagram of the printed circuit and switching array of FIG. 2.

In FIG. 3, the above-described printed circuit 7 of FIG. 2 is schematically illustrated. Herein, the common or ground conductor 27 is shown as having a first continuous strip 33 of switching material connected thereto and forming a plurality of series connected normally closed (N/C) switches 41, 43, 45 and 47. Another continuous strip 35 of switching material is connected to the common or ground conductor 27 and provides a plurality of series connected normally closed (N/C) switches 49, 51, 53 and 55.

Also, an energizing conductor 29 is connected to one flashlamp 57 of a plurality of flashlamps 59, 61, 63, 65, 67, 69 and 71. The energizing conductor 29 is also connected to one electrically conductive lead of a plurality of normally open (N/O) switches 73, 75, 77, and 79 and, upon activation of the normally open (N/O) switch 79, is connected to 81, 83 and 85 adjacent and connected to the flashlamps 59, 61, 63, 65, 67, 69 and 71. Moreover, each of the normally open (N/O) switches 73, 75, 77, 79, 81, 83 and 85 is connected to the common or ground conductor 27.

As to operation, it can be seen that an energy pulse applied to the energizing conductor 29 is received at a first flashlamp 57 which is also connected to the common or ground conductor 27 by way of the continuous strip 33 of switching material and the normally closed (N/C) switches 41, 43, 45 and 47. Thereupon, the energizing flashlamp 57 provides one path to the flashlamp 59 from the energizing conductor 29 while the normally open (N/O) switch 73 which has been activated by the flashlamp 57 provides a second path to the flashlamp 59 from the energizing conductor 29. Thus, parallel energizing paths are provided for all except the first lamp 57 so long as the flashlamps 57–71 become electrically conductive after activation.

Also, it is to be noted that the normally closed (N/C) switch 41 is rendered non-conductive upon activation of the flashlamp 57. Thus, the electrically conductive path from the energizing conductor 29 through the flashlamp 57 becomes possible as a redundency to the path through the normally open (N/O) switch 73. In other words, energization of a flashlamp 57 activates adjacent normally closed (N/C) switch 41 and normally open switch 73 to provide connection of the normally common and energizing conductors 27 and 29 to the following flashlamp 59.

Finally, it is to be noted that the first and second strips 33 and 35 of switching material are configured to provide isolation between the halves of the array. Moreover, the array is configured to provide switching of both the common or ground conductor 27 as well as switching of the energizing conductor 29.

While there has been shown and described what is at present considered the preferred embodiments of the invention, it will be obvious to those skilled in the art that various changes and modifications may be made therein without departing from the invention as defined by the appended claims.

INDUSTRIAL APPLICABILITY

An improved miniaturized multilamp photoflash array has a capability for switching both the common or ground conductor as well as the energizing conductor of the array. The configuration of the printed circuit greatly enhances the efficiency of fabrication by facilitating removal of scrap materials intermediate the desired printed configuration. Moreover, the circuitry and the array are inexpensive of materials and labor as well as components.

I claim:

1. In a miniaturized photoflash array having a circuit board with a printed circuit including common and energizing conductors on the inner surface thereof and a plurality of flashlamps each having a pair of electrically conductive leads connected to said printed circuit, the improvement comprising a plurality of normally closed (N/C) switches formed from at least one continuous strip of switching material and connecting a plurality of flashlamps to said common conductor of said printed circuit, a plurality of normally open (N/O) switches parallel coupling all except one of said plurality of flashlamps to said energizing conductor of said printed circuit and circuit means electrically coupling all except one of said flashlamps to a sequentially following flashlamp whereby parallel paths for energizing a sequentially following flashlamp by said energizing conductor are provided.

2. The improvement of claim 1 wherein a normally closed (N/C) switch adjacent each of said plurality of flashlamps is responsive to energization thereof for disconnecting said flashlamp from said common conductor of said printed circuit.

3. The improvement of claim 1 wherein a normally open (N/O) switch adjacent one of said plurality of flashlamps is responsive to energization from said flashlamp and connects another flashlamp to said energizing conductor of said printed circuit.

4. The improvement of claim 1 wherein activation of one of said flashlamps renders said flashlamp electrically conductive providing an electrically conductive path from said energizing conductor of said printed circuit to a following flashlamp and renders one of said normally open (N/O) switches electrically conductive to provide a parallel path from said energizing conductor of said printed circuit to said following flashlamp.

5. The improvement of claim 1 wherein said array includes two continuous strips of switching material forming a plurality of normally closed (N/C) switches coupled to a common conductor.

6. The improvement of claim 1 wherein said array includes two rows of flashlamps and switches and a continuous strip of switching material on each of said two rows forms a plurality of normally closed (N/C) switches coupled to a plurality of flashlamps.

7. A miniaturized multilamp photoflash array comprising a circuit board having a printed circuit thereon including common and energizing conductors, a plurality of flashlamps each having a pair of electrically conductive leads connected to said printed circuit, a plurality of normally closed (N/C) switches formed from at least one continuous strip of switching material and series connected to said common conductor and all but one of said normally closed (N/C) switches coupled to a pair of flashlamps and a plurality of normally open (N/O) switches each coupled to one of said flashlamps and parallel connected to said energizing conductor, and circuit means coupling each one except the last sequentially operably flashlamp of said array to a sequentially operable following flashlamp whereby parallel energizing paths are provided for all except one of said flashlamps.

8. The array of claim 7 wherein said normally closed (N/C) switches are formed from a pair of continuous strips of switching material coupled to said common conductor.

9. The array of claim 7 wherein each normally closed (N/C) switch is positioned and connected to effect disconnection of an adjacent flashlamp from said common conductor upon energization of said flashlamp.

10. The array of claim 7 wherein each normally open (N/O) switch is positioned and connected to electrically couple a following flashlamp to said energizing conductor upon energization of an adjacent flashlamp.

* * * * *